United States Patent [19]
Lien et al.

[11] Patent Number: 5,847,429
[45] Date of Patent: Dec. 8, 1998

[54] MULTIPLE NODE ESD DEVICES

[75] Inventors: Chuen-Der Lien, Los Altos; Paul Y. M. Shy, Saratoga, both of Calif.

[73] Assignee: Integrated Device Technology, Inc., Santa Clara, Calif.

[21] Appl. No.: 690,021

[22] Filed: Jul. 31, 1996

Related U.S. Application Data

[60] Provisional application No. 60/001,694 Jul. 31, 1995.

[51] Int. Cl.⁶ .................................................. H01L 23/62
[52] U.S. Cl. .......................... 257/355; 257/356; 257/353; 257/357; 257/360; 257/361; 257/366; 361/56; 361/58; 361/91
[58] Field of Search ..................................... 257/355, 356, 257/357, 360, 366, 353, 361, 369; 361/58, 56, 9

[56] References Cited

U.S. PATENT DOCUMENTS

| | | |
|---|---|---|
| 5,086,365 | 2/1992 | Lien . |
| 5,208,719 | 5/1993 | Wei . |
| 5,290,724 | 3/1994 | Leach . |
| 5,391,892 | 2/1995 | Devereaux et al. . |
| 5,401,997 | 3/1995 | Lien . |
| 5,563,436 | 10/1996 | Barret et al. ............................ 257/328 |
| 5,629,544 | 5/1997 | Voldman et al. ....................... 257/355 |
| 5,629,545 | 5/1997 | Leach ..................................... 257/362 |

OTHER PUBLICATIONS

Prior Art drawings, labeled as "Fig. 2b" and Fig. 2c.

*Primary Examiner*—Valencia Wallace
*Attorney, Agent, or Firm*—Bever & Hoffman

[57] ABSTRACT

An ESD protection device is provided which reduces the layout area required, utilizing multiple-node configurations and multiple node electrical couplings.

14 Claims, 9 Drawing Sheets

MULTIPLE NODE ESD DEVICES

This application claims benefit USC Provisional application Ser. No. 60/001,694, filed Jul. 31, 1995.

BACKGROUND OF THE INVENTION

1. Field of the Invention

This invention relates to a semiconductor structure which provides electrostatic discharge protection for an integrated circuit. More particularly the invention relates to a semiconductor structure which protects an integrated circuit during conditions of electrostatic discharge (ESD) during testing and other situations.

2. Description of the Prior Art

Integrated circuits (ICs) are generally susceptible to damage by ESD. ESD damage is primarily the result of handling by humans and/or machines. To avoid ESD damage, it is common practice to connect ESD protection devices to the pads of an IC. U.S. Pat. Nos. 5,290,724 and 5,208,719 are incorporated herein by reference for illustrating how ESD is generated and other general ESD principles.

During ESD testing, ESD pulses can be either positive or negative between any two pads. Theoretically, it would be desirable to place ESD devices between any two pads. However, damage is less likely to result from ESD from one I/O (input/output) pad with respect to another I/O pad because of the lack of direct current paths between them; ESD toward Vcc and Vss are more likely to damage ICs. Therefore, as a practical matter, ESD devices are commonly placed between pads and power supply rails, also referred to as voltage rails, (Vss and/or Vcc), as shown in FIGS. 1A–1C. FIG. 1A illustrates ESD protection for input pad 1 and providing an input to an integrated circuit not shown, input buffer 2. The circuit in FIG. 1A includes a pull-up ESD protection circuit 3 and a pull-down ESD protection circuit 4, connected respectively to Vcc and Vss power rails. A typical, prior art pull-down ESD structure is illustrated in FIG. 2, which will be described below. Pull-up ESD circuit 3 protects the input circuitry of the integrated circuit with respect to ESD voltages applied on input pad 1 with respect to power supply rail Vcc. Similarly, pull-down ESD circuit 4 protects the internal circuitry of the integrated circuit with respect to ESD voltages applied to input pad 1 with respect to power supply rail Vss.

ESD protection is provided in the circuit illustrated in FIG. 1B by the use of pull-up driver 5 which is connected between power supply rail Vcc and output pad 6 by providing pull-up driver 5 with a high current carrying capacity. Similarly pull-down driver 7 provides ESD protection for output pad 6 with respect to power supply rail Vss. Pre-driver 8 supplies drive signal to the gate of pull-up driver 5 and similarly pre-driver 9 provides a drive signal to the gate of pull-down driver 7.

Another prior art ESD protection circuit for an output pad is illustrated in FIG. 1C. In FIG. 1C a pull-up ESD circuit 10 is connected between voltage supply rail Vcc and output pad 11 and pull-down ESD circuit 12 is connected between output pad 11 and voltage supply rail Vss. These circuits provide protection for ESD events with respect to output pad 11 and voltage supply rails Vss and Vcc. Pull-up driver 13 is connected between voltage supply rail Vcc and output pad 11 in the usual fashion, and pull-down driver 14 is coupled between output pad 11 and the voltage supply rail Vss. The gates of pull-up driver 13 and pull-down driver 14 are driven respectively by pre-drivers 15 and 16.

Generally, the size of ESD devices ranges from 100 μm to 1000 μm. As a result, large layout areas are needed to place all desired ESD devices on an IC. Typically, several gate fingers are used in constructing an ESD device, such as shown in FIG. 2. Although four are shown in FIG. 2, six gates per ESD device is typical.

In the prior art, assuming each gate finger measured 50 μm, a single 300 μm ESD device would have six gates. One ESD device would be required to provide a discharge path from the pad to Vss (six gates for Vss/pad), a second ESD device would be required to provide a discharge path from the pad to Vcc (six gates for Vcc/pad) and a third ESD device would be required to provide a Vcc to Vss discharge path, for a total of 18 fingers and a 900 μm layout area for the three, two-node ESD devices FIG. 2 is a top plan view of a four-gate pull-down ESD device 17 which would typically be part of a prior art integrated circuit device. As illustrated in FIG. 2, all of the source regions (denoted by the letter S) are connected to supply rail Vss, and the pad to be protected is connected to the drain regions (denoted by the letter D) which are intermediate to the source regions. Gates 20–23 are positioned above channel regions. Electron flow is indicated by "e", and the current flow direction is indicated by the arrows on the lines between the source regions and the drain regions.

From the above it will be appreciated that in the prior art in order to protect an integrated circuit device from ESD events three ESD devices were required which could consume a significant amount of area on the integrated circuit being protected, which is of course a disadvantage since the area consumed by the ESD devices could better be used for additional circuitry to accomplish the task of the integrated circuit.

SUMMARY OF THE INVENTION

The present invention is directed to an ESD protection device for an integrated circuit device. The ESD device according to the present invention includes a plurality of gates and at least three separate regions within a common area of the IC. In one embodiment in which IC is an NMOS IC, the three regions are located in a single well of conductivity type different than the three regions. Two of the regions are connected to a different voltage and the third region is connected to a pad to be protected from an ESD event.

In another embodiment of the present invention, the ESD protection device includes a plurality of gates; a plurality of source regions connected to Vss; a plurality of drain regions connected to Vcc and a plurality of drain regions connected to a pad. The preferred embodiment of the present invention has source and drain regions that are part of an NMOS structure and reside in a single P-well.

DETAILED DESCRIPTION OF THE INVENTION

The present invention allows for a greater amount ESD discharge protection by providing an ESD device in a smaller amount of IC area, through the use of three or more nodes in the ESD device. The present invention also provides effective routing of current through Vcc-Vss paths in the event of a Vcc/Vss discharge event. In contrast to the prior art ESD protection devices which required three devices to achieve ESD protection for the three discharge events (Vss/pad, Vcc/pad and Vcc/Vss), with an attendant area required for each of the three devices, the present invention achieves those three protections by providing an ESD protection device in a common area.

Figure 3A:
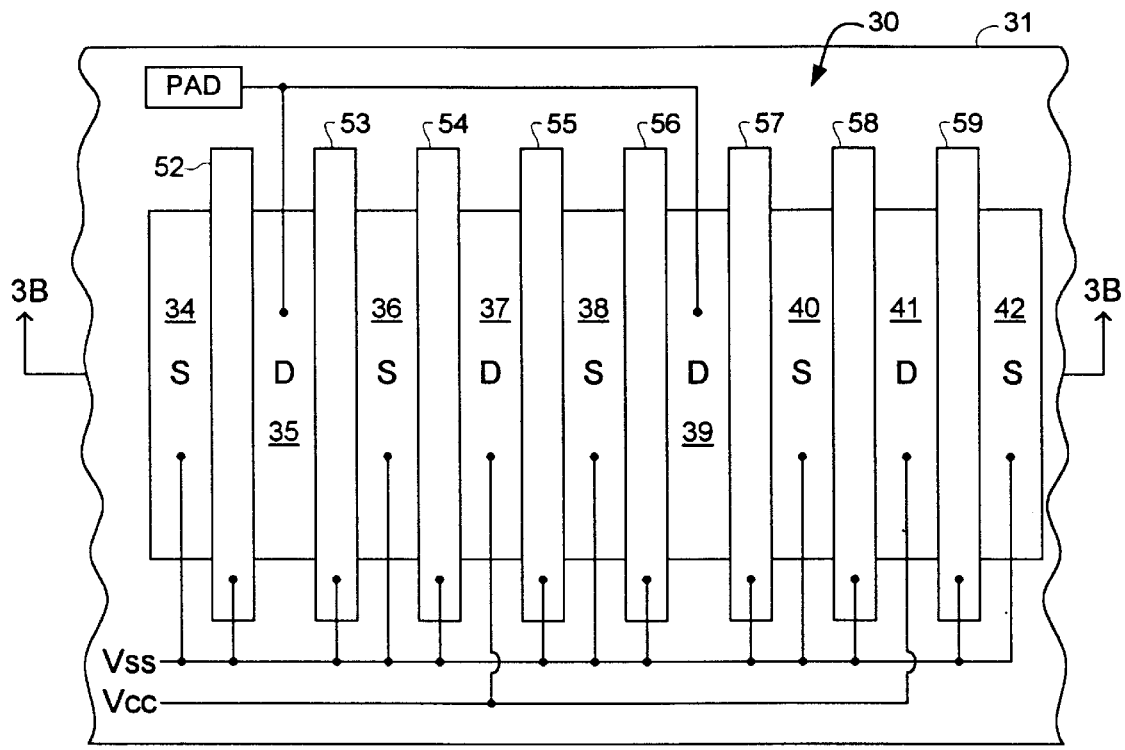
FIG. 3A is a top view of one embodiment of an ESD protection device in accordance with the present invention

Turning to FIG. 3A, a top plan view of ESD device 30 is illustrated. As indicated by perimeter line 31 which encircles device 30, ESD device 30 is a portion of an integrated circuit device, the remaining portion of which are not illustrated. More particularly, the ESD device 30 is a portion of an IC device constructed on an N-type substrate 32 which may be, for example, the basis for a NMOS IC structure. Concurrent reference to FIGS. 3A and 3B will assist the reader in understanding ESD device 30, FIG. 3B illustrating a cross section of FIG. 3A taken along the lines 3B—3B.

ESD device 30 in the NMOS embodiment is constructed in P-well 33 by providing a plurality of source and drain regions through suitable masking and doping techniques well known to those skilled in the art. It will of course be appreciated that FIG. 3A is merely illustrative in terms of the connections to the source and drain regions, these connections being made in the device by techniques also well known to those skilled in the art. N+ type regions 34–42 are formed in P-well 33 by techniques well known to those skilled in the art, these regions extending into a P-well 33 from surface 43. These N-type regions are spaced apart to form channel regions 44–51 as illustrated in FIG. 3B. Formed above each of the channel regions is a gate, denoted by reference characters 52–59 respectively. These gates may be formed in the traditional manner well known to those skilled in the art and are insulated from surface 43 using well known insulative material (not shown).

Figure 3B:
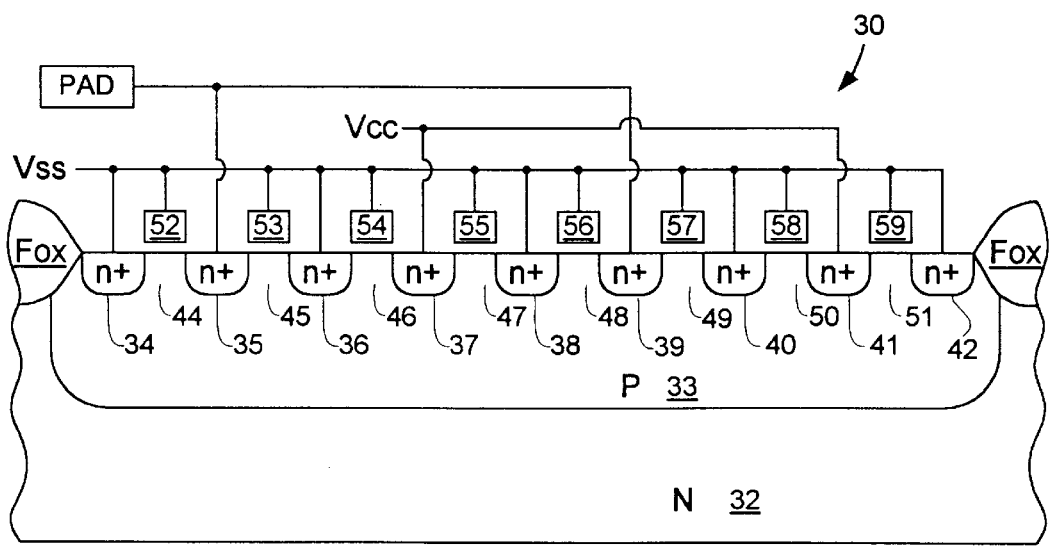
FIG. 3B is a cross-sectional view of the device of FIG. 3A taken along lines 3B—3B.

As illustrated in FIGS. 3A and 3B, each of the gates is connected to voltage rail Vss, this connection being referred to as having the gates grounded. Also referring to FIGS. 3A and 3B it will be noted that for each pad connection to its associated drain region, a source region is included on opposite sides of the pad connection, these source regions being connected to voltage rail Vss, and spaced apart by one channel width is a drain region which is connected to voltage supply rail Vcc. More particularly, in FIGS. 3A and 3B there are two sets of pad/Vss/Vcc connection combinations, for example, one set includes pad connection to region 35 along with an adjacent region connected to Vss (region 34) and another adjacent region connected to Vss (region 36), and finally another region connected to voltage supply rail Vcc (region 37). As will be better appreciated in the following explanation of the current flows for various applications of voltage to the nodes of this three node circuit (pad, Vss and Vcc) these regions provide discharge pads for all three discharge event combinations by including the regions in an opposite conductivity type region and providing channels for the current flow. In the first set of regions (34, 35, 36 and 37), region 34 is not essential and the operation of the invention requires only regions 35, 36 and 37 to achieve the discharge paths for the combination of ESD applications for which protection is being sought. If region 34 is not utilized, gate 52 is not required. Region 34 is, however, useful particularly in the instance where region 34 is near a guard ring of the associated integrated circuit device.

As will be appreciated by reference to FIGS. 3A and 3B, a second pad connection with associated regions is provided. More particularly, pad connection to region 39 along with the associated regions 38, 40, 41 and 42 which provide additional paths for current flow among the three nodes pad, Vss and Vcc.

Figure 3C:
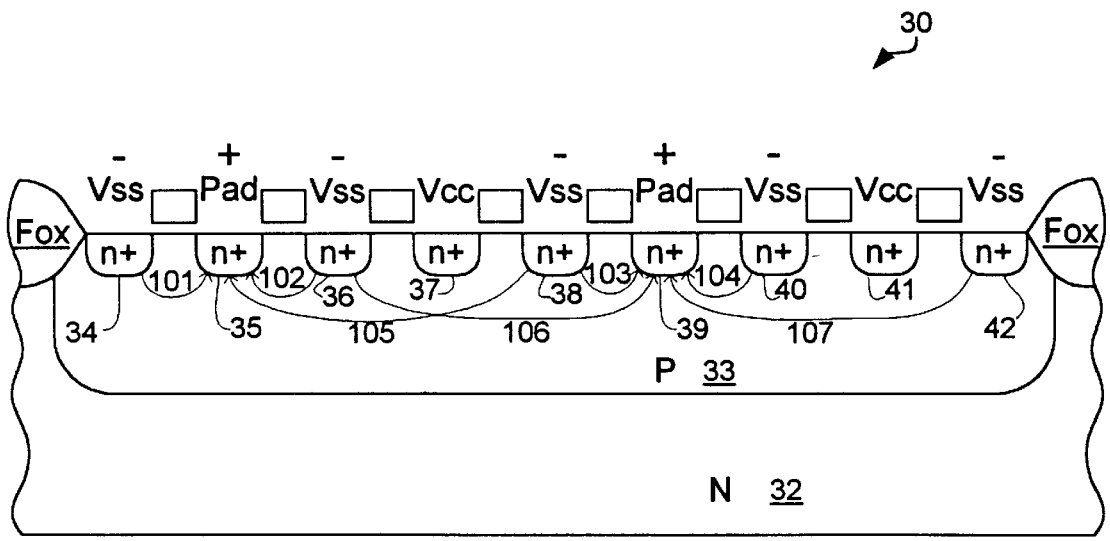
FIG. 3C illustrates electron-flow paths that may result from a positive ESD voltage being applied on a pad with respect to Vss in the device of FIG. 3A.
Figure 3D:
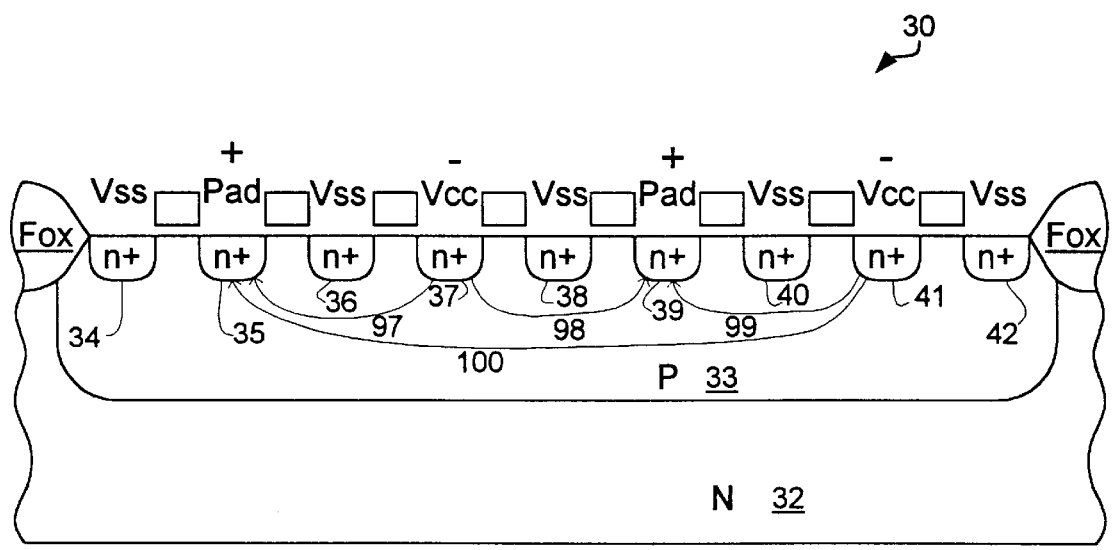
FIG. 3D illustrates electron flow paths that may result from a positive ESD being applied on a pad with respect to Vcc in the device of FIG. 3A.
Figure 3E:
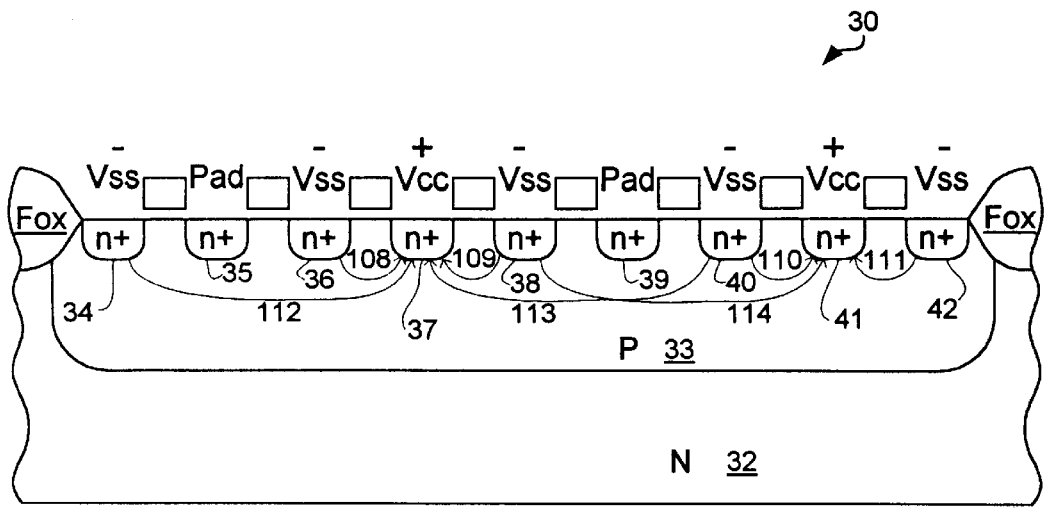
FIG. 3E illustrates electron flow paths that may result from a positive ESD being applied on Vcc with respect to Vss in the device of FIG. 3A.
Figure 3F:
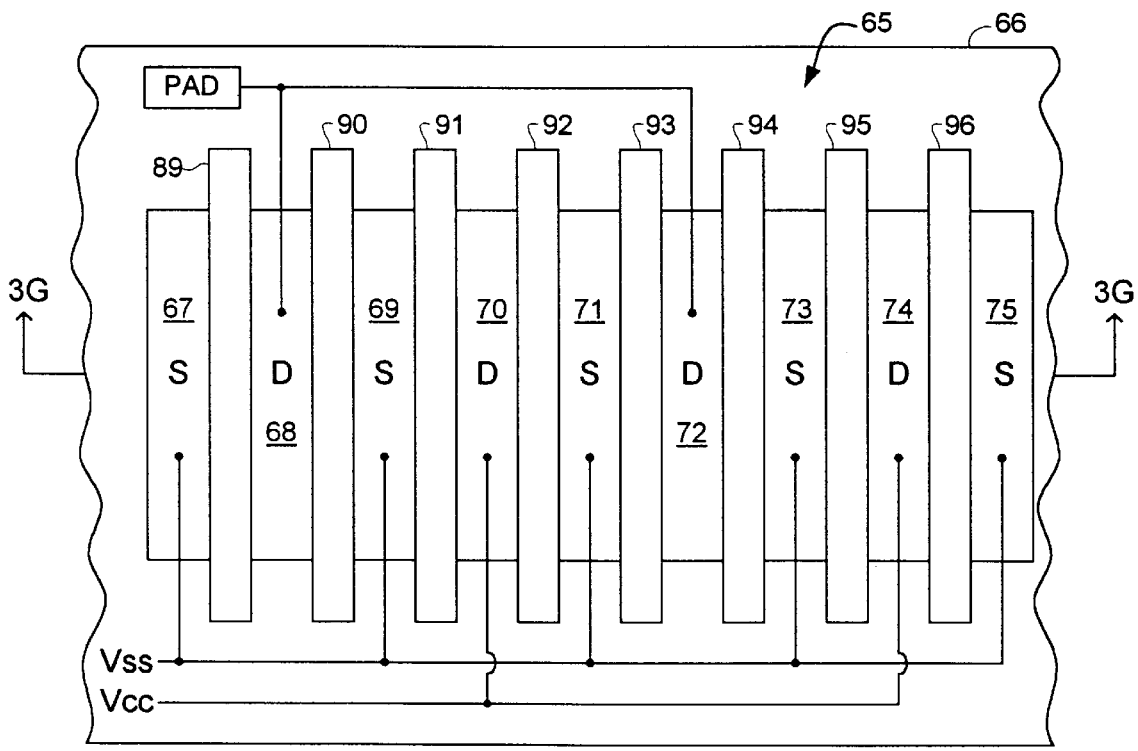
FIG. 3F is a top view of an ESD device in accordance with a second embodiment of the invention.
Figure 3G:
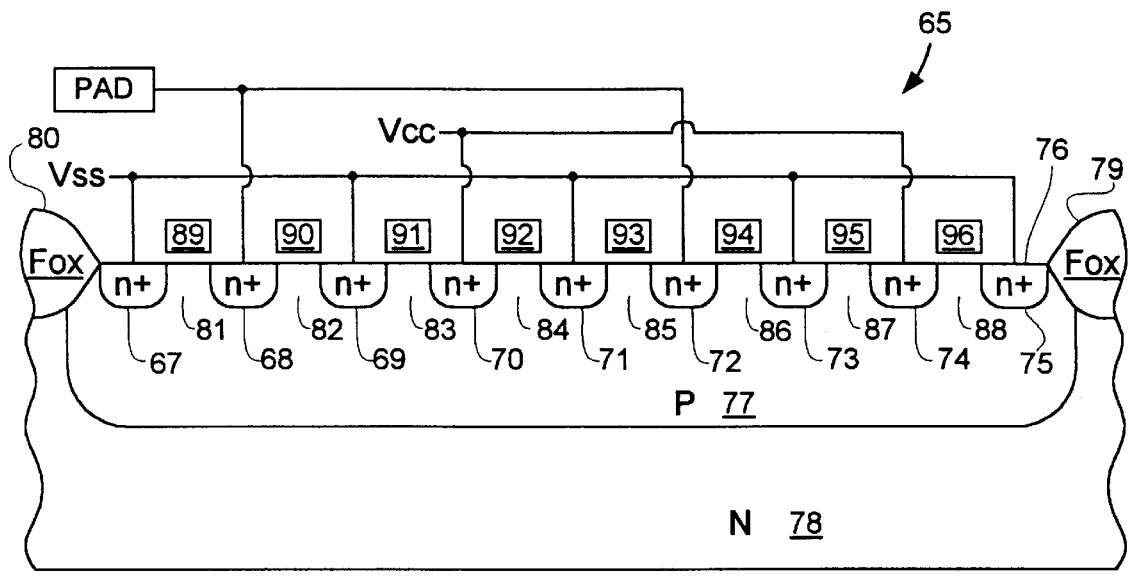
FIG. 3G is a cross-sectional view of FIG. 3F taken along the lines 3G—3G of FIG. 3F.

Although it will be appreciated by references to FIGS. 3A and 3B that the gates are grounded (or connected to Vss), an alternative embodiment is illustrated in FIG. 3F which provides an ESD protection device in accordance with the present invention in which the gates float. Referring to FIG. 3F, ESD device 65 is illustrated in a top view and in this embodiment the ESD device 65, as illustrated by perimeter line 66, is a portion of an associated integrated circuit structure not shown. FIG. 3G is a cross sectional taken along lines 3G—3G in FIG. 3F and illustrates, among other things, regions 67–75 extending into P-well 77 of N-type substrate 78. Field oxide portions 79 and 80 are illustrated in FIG. 3G, these field oxide portions defining the edge of active area of P-well 77. The field oxide may be formed in any of a number of ways well known to those skilled in the art. In ESD device 65 the drain regions indicated as 68, 70, 72, and 74, as well as the source regions indicated as 67, 69, 71, 73 and 75, are moderately doped. For example, the source and drain regions may be doped with arsenic or phosphorous with a dosage in the range of from about 1E 13 to 5E 15 atoms/cm$^2$. The spaced apart, N-type regions 67–75 provide channel regions 81–88 as illustrated in FIG. 3G. As is true of ESD device 30, ESD device 65 utilizes gates above the channel regions, the gates being electrically insulated from surface 76 of P-well 77. In FIG. 3G the gates are indicated by reference characters 89–96. As will be appreciated by a comparison of FIGS. 3A and 3F, the pad, Vss and Vcc electrical connections to the regions and the placements of the regions are the same.

In ESD device 65 P-well 77 may be established by doping substrate 78 with Boron to establish a doping concentration in the range of from about 1E 15 to about 5E 18 atoms/cm$^3$.

FIGS. 3C–3E illustrate, respectively, electron current flow paths when positive ESD voltage is applied to a pad with respect to Vss, Vcc, and further when a positive voltage is applied to Vcc with respect to Vss. For convenience of illustration the electrical connections to the pad, and the voltage rails Vss and Vcc are omitted in FIGS. 3C–3E and replaced with the nomenclature pad, Vss and Vcc, and + and − signs to indicate the polarity of the voltage application.

The present invention achieves increased amount of current flow by using unique multiple node layouts and multiple node electrical couplings. For example, in FIG. 3D, current paths 97, 98, 99 and 100 are illustrated between regions 37 and 41 which are connected to voltage rail Vcc, and regions 35 and 39 tied to the pad. The current between any nearest adjacent pair of these regions is virtually identical. Such nearly identical currents minimize the likelihood of charge breakdowns. Thus, approximately the same amount of current is passed through current paths 97, 98 and 99. By contrast, current path 100 has much higher resistivity and therefore less current flows through it.

With reference to FIG. 3C which illustrates electron current flow for a positive potential applied to the pad with respect to voltage rail Vss, each nearest adjacent pair of ass/pad couplings 101, 102, 103 and 104 will also have approximately an equal amount of current passing through it, although not necessarily the same amount that passes through the adjacent part Vcc/Vss node combination FIG. 3E or the Vcc/pad node combination FIG. 3D paths.

Similarly, in FIG. 3E which illustrates electron current flow path for a positive potential applied to voltage rail Vcc with respect to voltage rail Vss, each nearest adjacent Vcc/Vss coupling 108, 109, 110 and 111 will have about equal amounts of current pass through as each nearest Vss/pad coupling (FIG. 3C) within the same structure. The longer Vcc/Vss paths 112, 113 and 114 will have about an equal amount of current flow, but less than that in the 108, 109, 110 and 111 paths.

Equal amounts of current are transmitted in nearest adjacent pairs because in the present invention the couplings are uniformly laid out. Thus, for example, Vcc/Vss couplings have substantially the same resistance due to placement of each Vss in a position approximately equidistant from each Vcc. Vcc/pad couplings have substantially the same resistance as each other and the resistance along each Vss/pad coupling is approximately equal. Although each Vcc/pad coupling is separated by a Vss in the layout, this Vss region does not interfere with the Vcc/pad coupling, because Vss is passive.

In the present invention, the gates of ESD devices 30 and 120 are at ground (Vss). However, the 3-node ESD devices have the benefit of some low resistance paths that allow current to flow through as shown in FIGS. 3C–E. The allocation of current flow through multiple paths can be further refined by adjusting the distance between start and end points of current flow.

Figure 4:
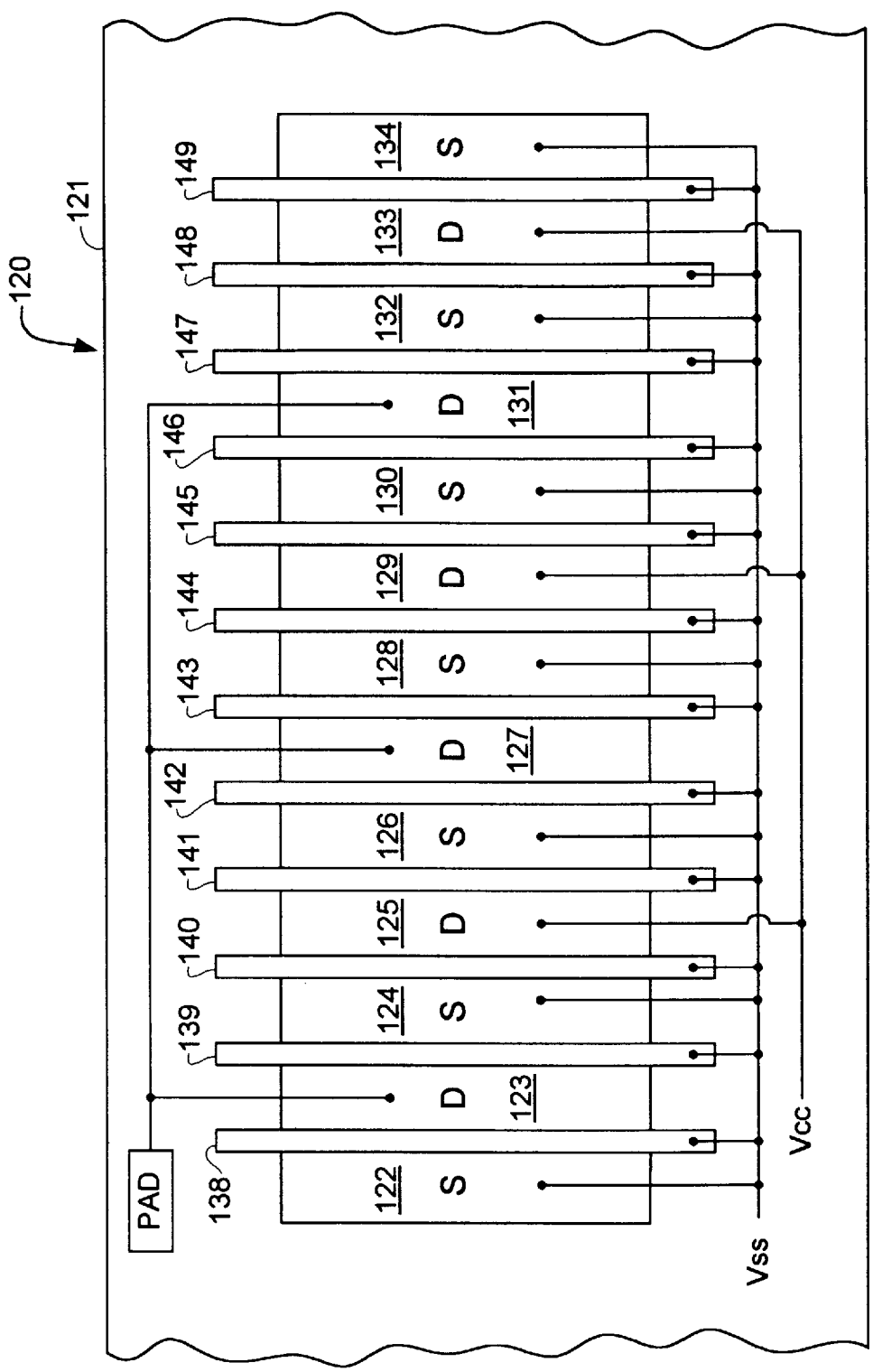
FIG. 4 is a top view of another ESD device of the type illustrated in FIG. 3A in accordance with the present invention.

FIG. 4 illustrates a twelve-gate version of an ESD protection device. The embodiment of the present invention depicted in FIG. 4 provides three, 3-node ESD devices, utilizing only 12 fingers and therefore occupying only 600 $\mu$m of layout area the same protection which in the prior art required three two-node devices requiring a total of 900 $\mu$m layout areas. In addition, the 3-node structure of the present invention occupies a single well, while in the prior art, separate ESD devices required an area separating each device from the other, thus allowing for additional space savings. Referring to FIG. 4, ESD device 120, which is part of an integrated circuit device not shown, is illustrated in top view. Line 121 indicates the perimeter of an area which contains ESD device 120. Comparing ESD device 120 with ESD device 30 in FIG. 3A, it will be appreciated that ESD protection of three pads (input pad 135, output pad 136 and output pad 137) may be achieved in combination ESD device 120 which occupies only 600 um of layout area. Alternatively, these three pad/region connections could be connected in common to provide additional current carrying capacity for one pad to be protected. It will be appreciated by comparing FIG. 3A and FIG. 4 that the additional similarity of having the gates grounded is also common to both device 30 and 120. Alternatively, as described above with respect to FIG. 3F, the gates could be allowed to float. Also consistent with the structure of ESD device 30, regions 122–134 may be N-type formed in a P-type well which is part of a N-type substrate. Gates 138–149 are positioned above channel regions between the N-type regions in the same manner as illustrated in FIG. 3B for the device 30. The pad regions 123, 127 and 131 may be either all input or output pads. It is also desirable to include two-node, three-node and four-node ESD devices on the same integrated circuit chip.

Figure 1A:
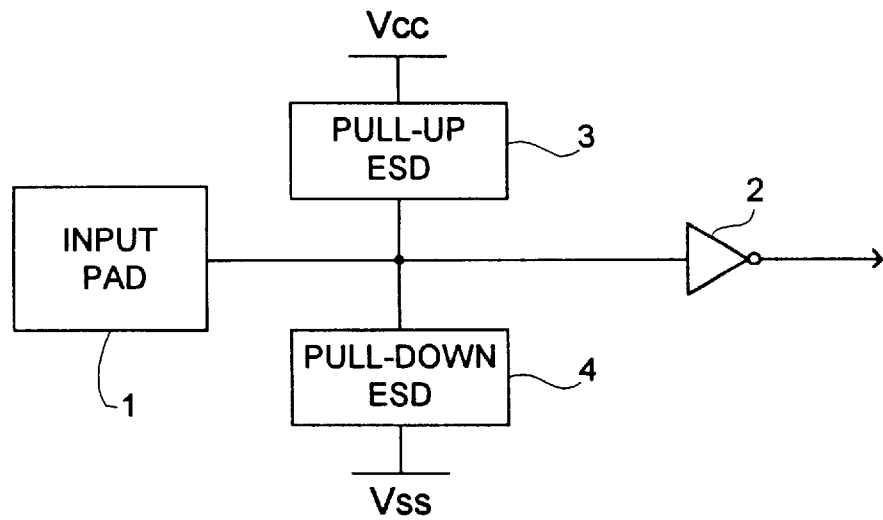
FIGS. 1A–C illustrate conventional arrangements of ESD devices relative to pad and voltage supply rails.
Figure 1B:
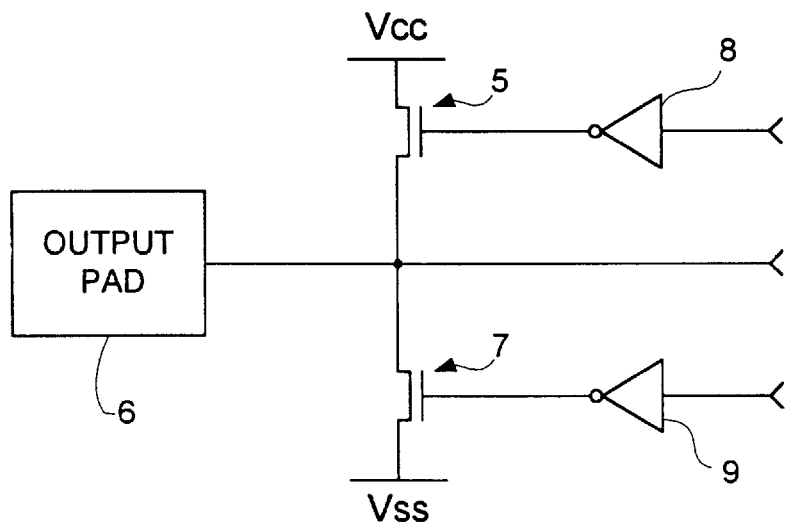
Figure 1C:
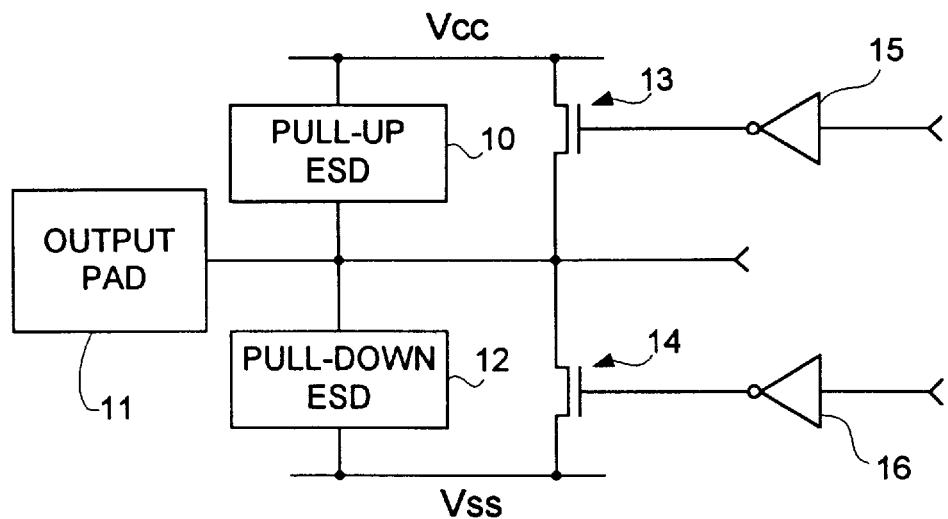
Figure 2A:
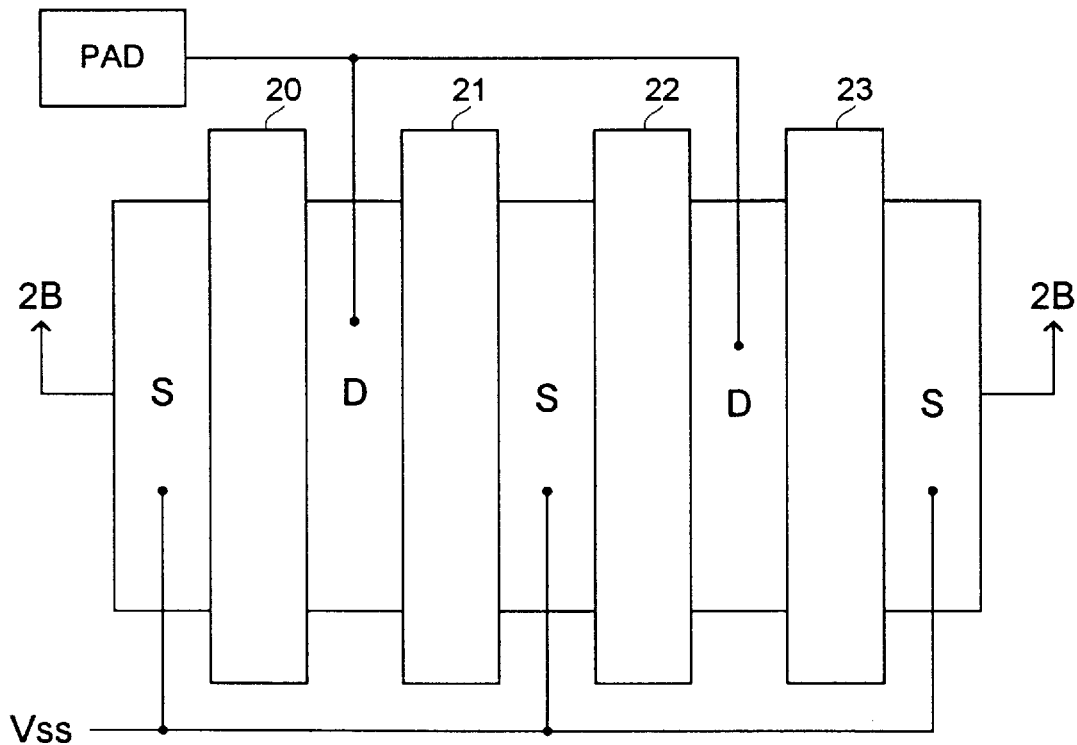
FIG. 2 illustrates the top view of a prior art ESD device constructed with four gates.
Figure 2B:
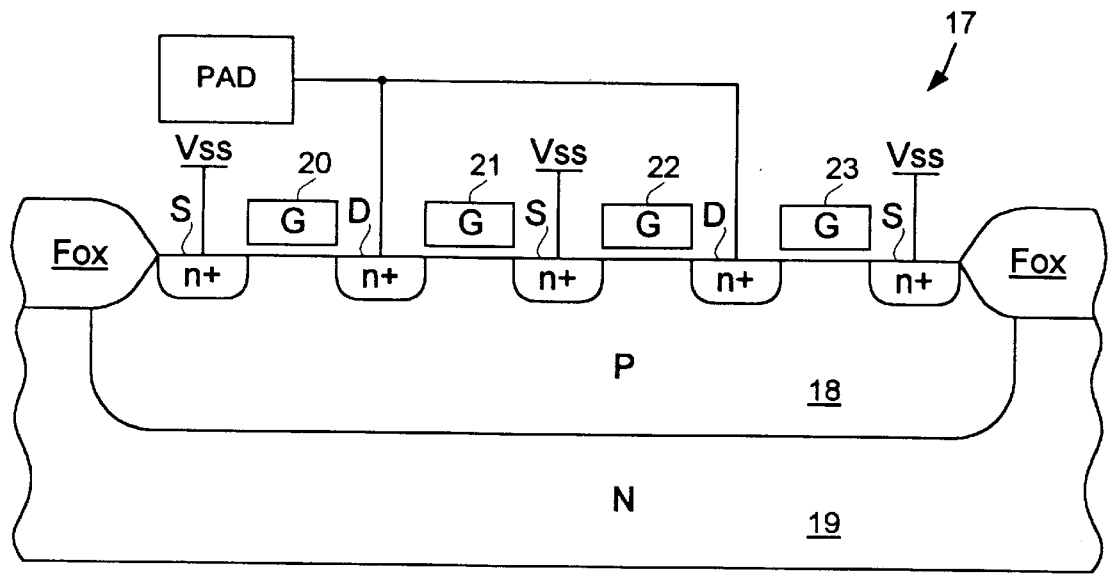
Figure 2C:
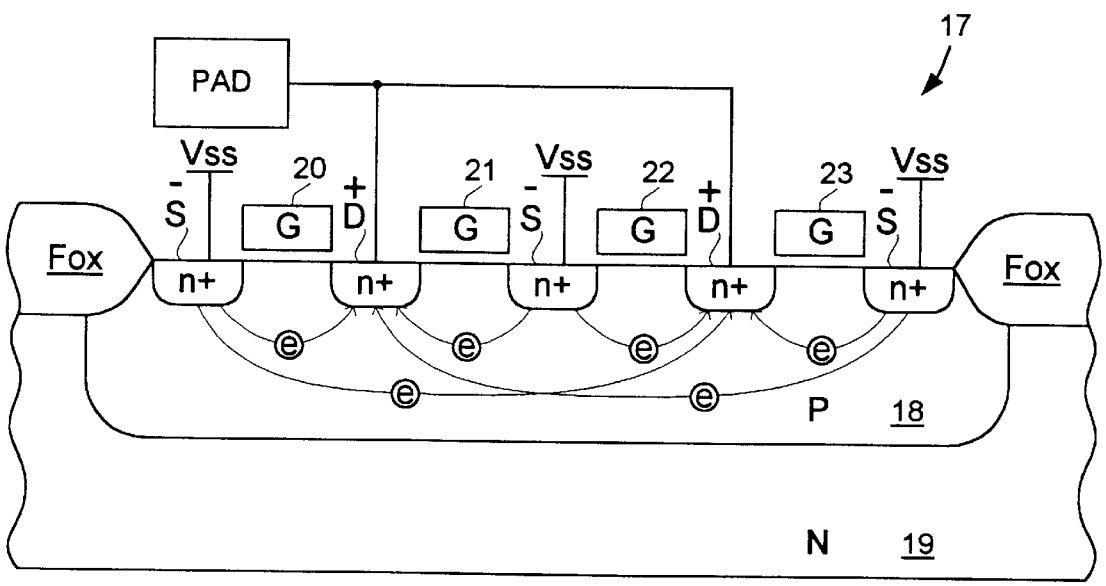

To illustrate how an ESD device in accordance with the present invention, such as ESD device 30 might be utilized in place of the prior art circuits in FIGS. 1A and 1C, the following possibilities are representative. For example, in FIG. 1A pull-up ESD circuit 3 and pull-down ESD circuit 4 could be replaced with ESD device 30 by connecting the pad of ESD device 30 to input pad 1. In addition to providing pull-up and pull-down protection for input pad 1, ESD circuit 30 would also provide protection for ESD voltage application between supply rail Vss and supply rail Vcc. Similarly, ESD device 30 could be used in FIG. 1C to replace pull-up ESD device 10 and pull-down ESD device 12 by connecting the pad terminal of ESD device 30 to the output pad 11. Pull-up driver 13 and pull-down driver 14 could be retained in the circuit.

Figure 5:
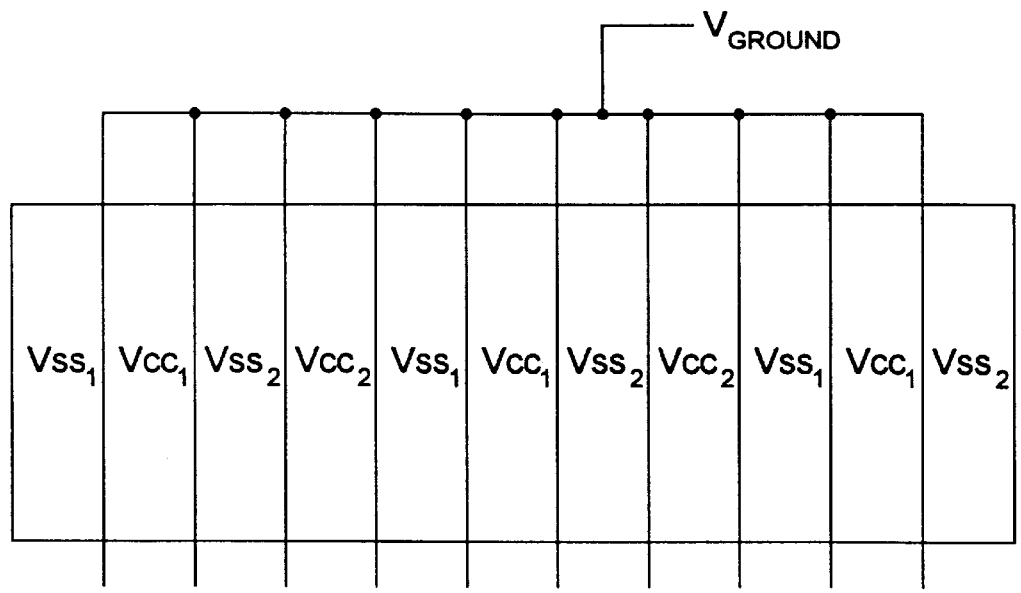
FIG. 5 is a top view of another embodiment of an ESD device in accordance with the present invention.

If a three-node ESD device in accordance with the present invention is used with a large number of power pads (e.g. for multiple Vss and/or multiple Vcc supply rails, as shown in FIG. 5), and possibly even between I/O pads (non-power pads), ESD devices can be evenly distributed between Vcc and Vss in addition to providing ESD protection for every pad. Referring to FIG. 5, a four-node ESD device 160 is illustrated. In a fashion similar to that illustrated in the other ESD devices of the present invention, the ESD device 160 is included in a portion of an integrated circuit device (not shown) and the perimeter of the ESD device 160 is indicated at 161. ESD device 160 is a four-node device, having nodes Vss1, Vcc1, Vss2 and Vcc2. Each of these four nodes is connected to an associated group of regions denoted by corresponding nomenclature. As will further be appreciated by reference to FIG. 5, the gates indicated at 162, 163, 164, 165, 166, 167, 168, 169, 170 and 171 are grounded. Similarly, the multiple-node ESD structure of the present invention can be used between two adjacent pads such as Vss and Vcc. Devices with more than 4 nodes are also possible. Clearly, multiple-node PMOS or field effect transistors may also be used in place of the above-described NMOS structures to provide ESD protection in accordance to the present invention.

Figure 6:
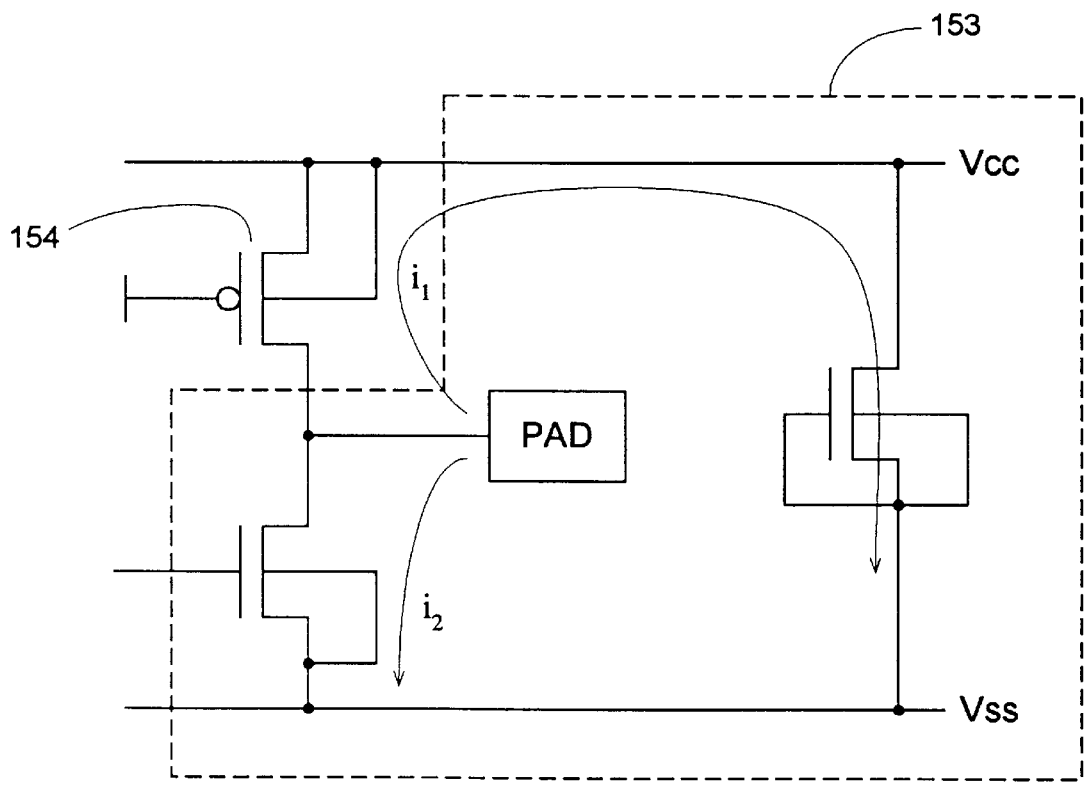
FIG. 6 is a schematic drawing that illustrates how current may be uniformly distributed in an embodiment of the present invention.

As indicated above in the brief description of the drawings, FIG. 6 is a schematic that illustrates how current may be uniformly distributed in one embodiment of the present invention. Referring to FIG. 6, current flow paths $i_1$ and $i_2$ illustrate flow when an ESD device in accordance with the present invention is used in conjunction with a PMOS transistor which is part of an IC device. The circuitry within dashed line 153 represents schematically an ESD device in accordance with the present invention. PMOS transistor 154 provides an additional discharge path for the pad.

We claim:

1. An electrostatic discharge protection device for an integrated circuit device including a first voltage rail, a second voltage rail and a pad, said electrostatic discharge protection device comprising:

a first region of semiconductor material of a first conductivity type;

a second region of semiconductor material of a second conductivity type extending into said first region from a surface of said first region, said second region being connected to said pad;

a third region of semiconductor material of said second conductivity type extending into said first region from said surface, said third region being connected to said first voltage rail;

a fourth region of semiconductor material of said second conductivity type extending into said first region of semiconductor material from said surface, said fourth region being positioned between said second and third regions such that a first channel is defined by said semiconductor material of said first conductivity type located between said second region and said fourth region, and a second channel is defined by said semiconductor material of said first conductivity type located between said third region and said fourth region, said fourth region being connected to said second voltage rail;

a first gate positioned above said first channel; and a second gate positioned above said second channel.

2. An electrostatic discharge protection device according to claim 1, wherein said first and second gates are connected to one of said first and second voltage rails.

3. An electrostatic discharge protection device according to claim 1 further comprising:

a fifth region of semiconductor material of said second conductivity type extending into said first region from said surface, said fifth region being positioned adjacent to and spaced from said second region such that a third channel is defined by said semiconductor material of said first conductivity type located between said second region and said fifth region, said fifth region being connected to said second voltage rail; and a third gate positioned above said third channel.

4. An electrostatic discharge protection device according to claim 3, wherein said first, second and third gates are connected to one of said first and second voltage rails.

5. An electrostatic discharge protection device according to claim 1, wherein said first region of semiconductor material comprises a well region positioned in a substrate of said integrated circuit device.

6. An electrostatic discharge protection device for an integrated circuit device including a first voltage rail, a second voltage rail, and a pad, said electrostatic discharge protection device comprising:

a first region of semiconductor material of a first conductivity type;

a plurality of regions of semiconductor material of a second conductivity type extending into said first region from a surface of said first region, said plurality of regions of second conductivity type being spaced apart to define a channel region in said semiconductor material of said first conductivity type between adjacent ones of said plurality of regions; and a plurality of gates, each of said gates being positioned above an associated one of said channel regions, wherein a first set of said regions of second conductivity type material is connected to said first voltage rail, a second set of said regions of second conductivity type material is connected to said second voltage rail and a third set of said regions of said second conductivity type material is connected to said pad, and wherein predetermined ones of said second conductivity type regions connected to said pad are positioned between said second conductivity type regions connected to said first voltage rail.

7. An electrostatic discharge protection device according to claim 6 wherein said gates are connected to one of said first and second voltage rails.

8. An electrostatic discharge protection device according to claim 6 wherein said first region of semiconductor material comprises a well region positioned in a substrate of said integrated circuit device.

9. An electrostatic discharge protection device for an integrated circuit device including first, second and third pads defining first, second and third electrical nodes, respectively, said electrostatic discharge protection device comprising:

a first region of semiconductor material of a first conductivity type;

a second region of semiconductor material of a second conductivity type extending into said first region from a surface of said first region, said second region being connected to said first electrical node;

a third region of semiconductor material of said second conductivity type extending into said first region from said surface, said third region being connected to said second electrical node;

a fourth region of semiconductor material of said second conductivity type extending into said first region of semiconductor material from said surface, said fourth region being positioned between said second and third regions such that a first channel is defined by said semiconductor material of said first conductivity type located between said second region and said fourth region, and a second channel is defined by said semiconductor material of said first conductivity type located between said third region and said fourth region, said fourth region being connected to said third electrical node;

a first gate positioned above said first channel; and a second gate positioned above said second channel.

10. An electrostatic discharge protection device according to claim 9, wherein said integrated circuit device further includes a first voltage rail, and a second voltage rail, and wherein one of said first, second and third pads is connected to one of said first and second voltage rails.

11. An electrostatic discharge protection device according to claim 9, wherein said integrated circuit device further comprises a first voltage rail and a second voltage rail, and wherein one of said pads is connected said first voltage rail and another one of said pads is connected to said second voltage rail.

12. An electrostatic discharge protection device according to claim 10, wherein said first and second gates are connected to one of said first and second voltage rails.

13. An electrostatic discharge protection device according to claim 11, wherein said first and second gates are connected to one of said first and second voltage rails.

14. An electrostatic discharge protection device according to claim 9, wherein said first region of semiconductor material comprises a well region positioned in a substrate of said integrated circuit device.

* * * * *